United States Patent
Chew et al.

(10) Patent No.: US 7,349,515 B1
(45) Date of Patent: Mar. 25, 2008

(54) METHOD AND AN APPARATUS TO IMPROVE PRODUCTION YIELD OF PHASE LOCKED LOOPS

(75) Inventors: Chwei-Po Chew, Cupertino, CA (US); Paul H. Scott, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 639 days.

(21) Appl. No.: 10/919,665

(22) Filed: Aug. 16, 2004

Related U.S. Application Data

(60) Provisional application No. 60/505,198, filed on Sep. 22, 2003.

(51) Int. Cl.
*H03D 3/24* (2006.01)
(52) U.S. Cl. ...................................... 375/376
(58) Field of Classification Search ................ 375/379, 375/375, 376, 215, 294, 327; 327/148, 157, 327/147, 156, 336; 342/103; 455/180.3, 455/266; 331/1 R, 25, 1 A
See application file for complete search history.

(56) References Cited

U.S. PATENT DOCUMENTS

| | | | |
|---|---|---|---|
| 5,355,097 A | 10/1994 | Scott et al. | |
| 5,745,011 A | 4/1998 | Scott | |
| 5,896,068 A | 4/1999 | Moyal | |
| 5,952,888 A | 9/1999 | Scott | |
| 6,084,479 A | 7/2000 | Duffy et al. | |
| 6,177,843 B1 | 1/2001 | Chou et al. | |
| 6,351,168 B1 | 2/2002 | Li et al. | |
| 6,373,302 B1 | 4/2002 | Li et al. | |
| 6,628,171 B1 | 9/2003 | Chou et al. | |
| 7,058,120 B1* | 6/2006 | Lu et al. | 375/214 |
| 7,142,622 B1* | 11/2006 | Brunn et al. | 375/375 |
| 2003/0020526 A1* | 1/2003 | Ingino, Jr. | 327/157 |
| 2003/0223526 A1* | 12/2003 | Sorna | 375/376 |
| 2004/0033793 A1* | 2/2004 | Gauthier et al. | 455/180.3 |
| 2004/0210790 A1* | 10/2004 | Moon et al. | 713/500 |

* cited by examiner

*Primary Examiner*—Sam K. Ahn
(74) *Attorney, Agent, or Firm*—Blakely, Sokoloff, Taylor & Zafman LLP

(57) ABSTRACT

An apparatus and a method for improving production yield of phase locked loops (PLLs) have been disclosed. One embodiment of the apparatus includes a PLL comprising a charge pump and an offset compensation circuit coupled to the charge pump to provide an offset current to the charge pump to reduce a static phase error of the PLL caused by a mismatch in at least one of a process variation, a voltage, and a temperature. Other embodiments are described and claimed.

12 Claims, 7 Drawing Sheets

-- PRIOR ART --

METHOD AND AN APPARATUS TO IMPROVE PRODUCTION YIELD OF PHASE LOCKED LOOPS

REFERENCE TO RELATED APPLICATION

This application claims the benefit of U.S. Provisional Application No. 60/505,198, filed on Sep. 22, 2003.

FIELD OF INVENTION

The present invention relates generally to integrated circuits, and more particularly, to phase locked loops (PLL).

BACKGROUND

In electronic systems, good clock distribution is very important to the overall performance of the electronic systems in general. Unwanted clock skew and jitter typically result from poor clock distribution and cause problems in the design and operation of the electronic systems. Techniques have been developed using PLLs to mitigate the effect of these problems to manageable levels. Therefore, PLLs are widely used in electronic circuits.

When PLLs are implemented in integrated circuits (IC), variations in behavior may occur due to device mismatch, offset, and/or leakage. These undesirable variations may affect the static phase error (SPE) of signals sampled by the output clock signals of the PLLs. The SPE is defined as the deviation from the crossing of a sampling clock to the center of an eye diagram of the signals sampled. FIG. 1A shows a sample eye diagram for a signal sampled by an existing PLL.

FIG. 1B shows one conventional PLL. The PLL 100 includes a number of fixed path delay elements 110 inserted into the signal paths between a sampling clock and input data to tune or to adjust the SPE. By adjusting the setup and hold time of the sampling flip-flop 120, the bit error rate can be reduced. Typically, the fixed path delays 100 are built with resistive and capacitive (RC) components, buffers, and/or metal lines.

However, the conventional PLL suffers from a number of disadvantages. One disadvantage of the conventional technology is the extra deterministic jitter, also known as inter symbol interference (ISI). The ISI may be generated as the fixed path delays are used to tune the SPE. Furthermore, since various offsets and mismatches in the conventional PLL might be random, having one fixed delay setting as provided by the fixed delay elements 110 in FIG. 1B may not provide satisfactory SPE compensation across process variation, voltage, and temperature (PVT). Without a satisfactory SPE compensation across PVT, the production yield of PLLs falls. Having a satisfactory production yield is important in making a semiconductor product successful because it is typically uneconomical to manufacture a low yield product. An improvement in yield usually corresponds to an increase in profit. Furthermore, the cost of an IC is typically a function of the die size, wafer cost, technology, and yield (i.e., number of good dies per wafer). The issue of yield improvement is especially critical in highly integrated products with high die area, in which PLLs are widely used.

BRIEF DESCRIPTION OF THE DRAWINGS

The present invention will be understood more fully from the detailed description that follows and from the accompanying drawings, which however, should not be taken to limit the appended claims to the specific embodiments shown, but are for explanation and understanding only.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. Furthermore, the term "to connect" as used in the current description may include both to directly connect and to indirectly connect. Likewise, the term "to couple" as used herein may include both to directly couple and to indirectly couple.

Figure 2A:
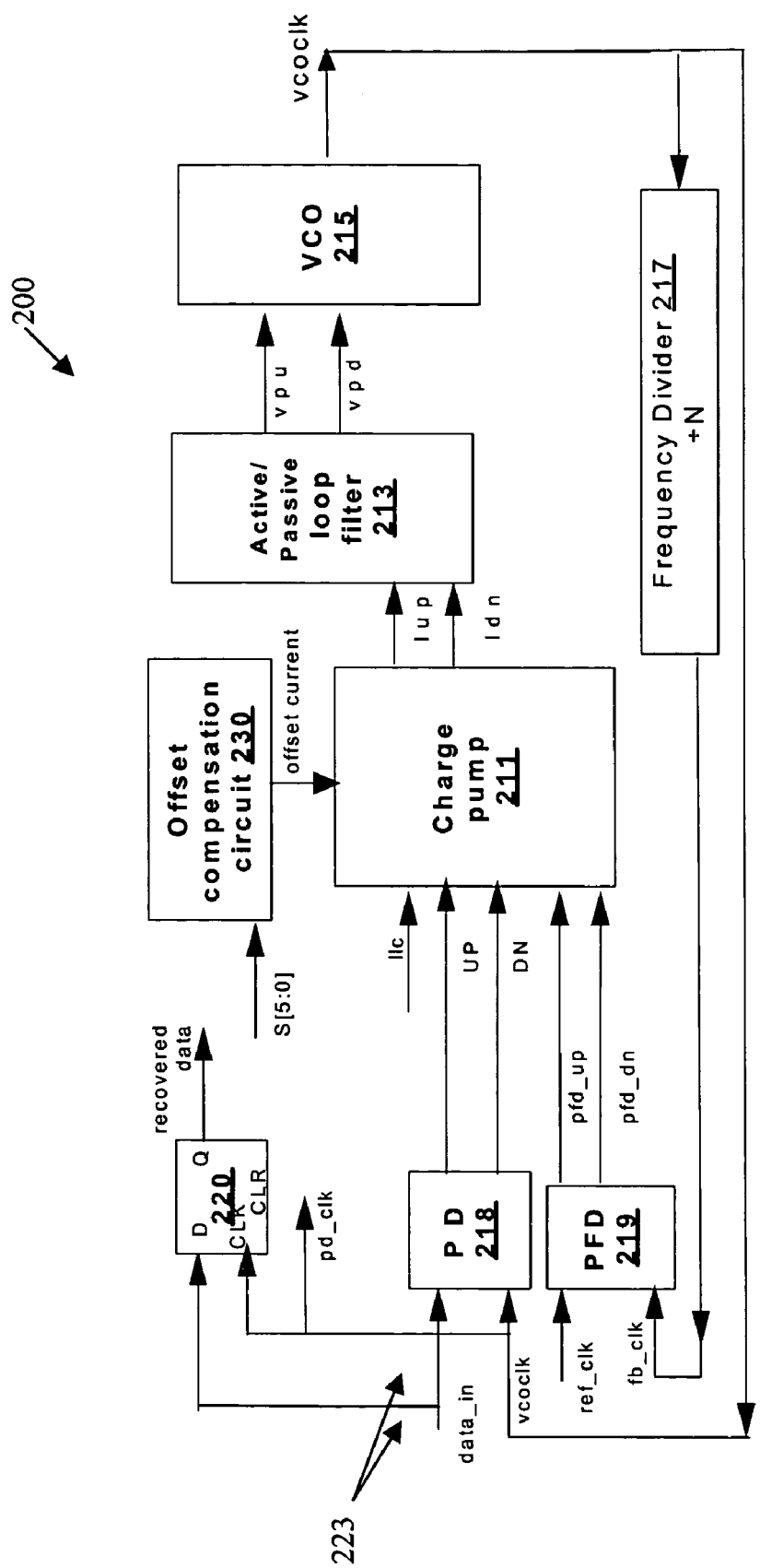
FIG. 2A shows one embodiment of a phase locked loop with offset compensation.

FIG. 2A shows one embodiment of a phase locked loop (PLL) with offset compensation. The PLL 200 includes a charge pump 211, a loop filter 213, a voltage controlled oscillator (VCO) 215, a frequency divider 217, a phase detector (PD) 218, a phase frequency detector (PFD) 219, a sampling flip-flop 220, and an offset compensation circuit 230. Alternatively, the charge pump 211 may be replaced with a Gm transconductance cell. In some embodiments, the offset compensation circuit 230 is implemented nearer to the charge pump 211 than the sampling flip-flop 220. By implementing the offset compensation circuit 230 nearer to the charge pump 211, deterministic jitter caused by the delay path 223 may be reduced. Furthermore, it should be noted that the fixed path delay 110 in the conventional PLL 100 has been eliminated in the embodiment of the PLL 200 in FIG. 2A by having the offset compensation circuit 230. More detail of the offset compensation circuit 230 will be discussed below.

Note that any or all of the components and the associated hardware illustrated in FIG. 2A may be used in various embodiments of the PLL 200. However, it should be appreciated that other configurations of the PLL 200 may include more or less devices than those shown in FIG. 2A.

In one embodiment, the offset compensation circuit 230 provides an offset current to the charge pump 211. The charge pump 211 may be pre-offset biased. For example, the charge pump 211 may be pre-offset biased at 32 uA. The charge pump 211 provides an up current ($I_{up}$) and a down current ($I_{dn}$) to the loop filter 213. The loop filter 213 may include an active filter or a passive filter. The loop filter 213 outputs an up voltage (Vpu) and a down voltage (Vpd) to the VCO 215. Then the VCO 215 generates an output clock signal (vcoclk) based on Vpu and Vpd. The VCO 215 sends vcoclk to the frequency divider 217, which divides the frequency of vcoclk by a predetermined value, N, and generates a feedback clock signal, fb_clk.

In one embodiment, a reference clock signal (ref_clk) and fb_clk are input to the PFD 219. Based on fb_clk and ref_clk, the PFD 219 outputs at least two signals, pfd_up and pfd_dn, to the charge pump 211 to provide feedback to the charge pump 211. In some embodiments, vcoclk is input to the PD 218. A data signal (data_in) is also input to the PD 218. Based on vcoclk and data_in, the PD 218 outputs two signals, UP and DN, to the charge pump 211 to provide feedback to the charge pump 211. In addition to the PD 218, vcoclk and data_in are also input to the sampling flip-flop 220. The sampling flip-flop 220 recovers data_in using vcoclk and the recovered data is output at the Q-terminal of the sampling flip-flop 220.

In one embodiment, the PLL 200 is used in a transmit loop in a networked device (e.g., a router, a switch, etc.) to transmit signals. Such a PLL 200 may include the PFD 219, but not the PD 218. In an alternative embodiment, the PLL 200 is used in a receive loop in a networked device (e.g., a router, a switch, etc.) to receive incoming signals. Such a PLL 200 may include the PD 218, but not the PFD 219. Alternatively, a PLL 200 in a receive loop may include both the PD 218 and the PFD 219 such that the PFD 219 loop gets a coarse (or initial) frequency lock by pulling the frequency of vcoclk closer to the frequency of data_in. Then the PLL 200 may switch to the PD 218 loop. Such a dual loop design may prevent false locking of the PLL 200.

Figure 2B:
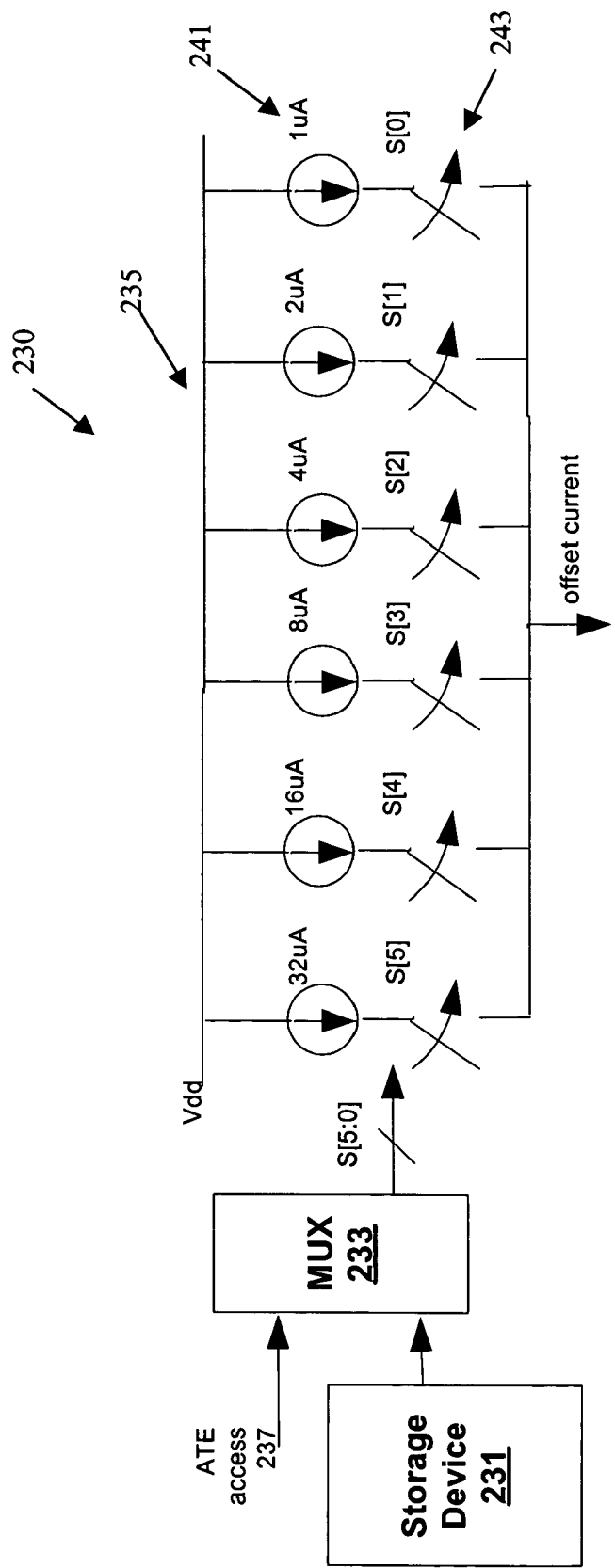
FIG. 2B shows one embodiment of an offset compensation circuit.

FIG. 2B shows one embodiment of an offset compensation circuit 230. The offset compensation circuit 230 includes a storage device 231, a multiplexer (MUX) 233, and a programmable current source 235. The storage device 231 may include at least one flash register. Alternatively, the storage device 231 may include at least one fuse. The storage device 231 is coupled to a first input of the MUX 233. The MUX 233 also receives a second input 237 from another source. More details on the second input 237 will be described below. THe MUX 233 selects one of the first and the second inputs and outputs the selected input as a setting (e.g., S[5:0]) to the programmable current source 235.

Figure 1A:
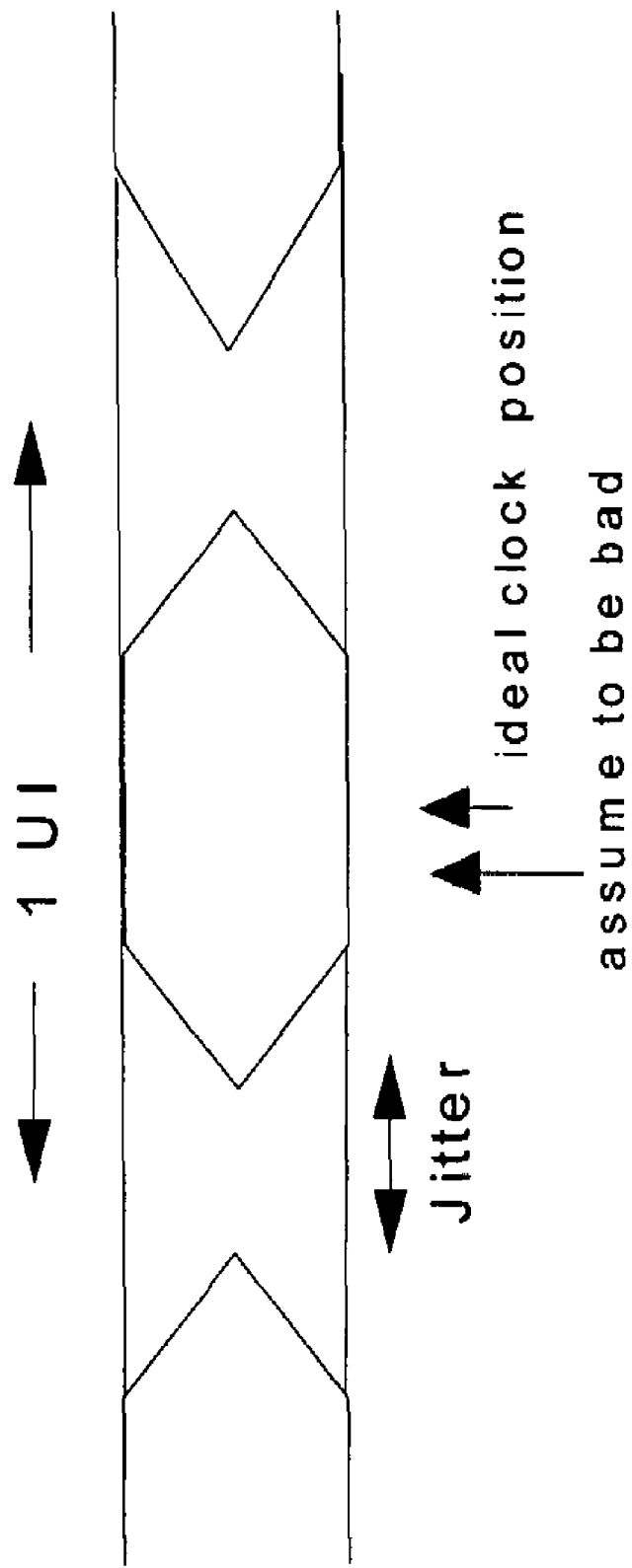
FIG. 1A shows a sample eye diagram.
Figure 1B:
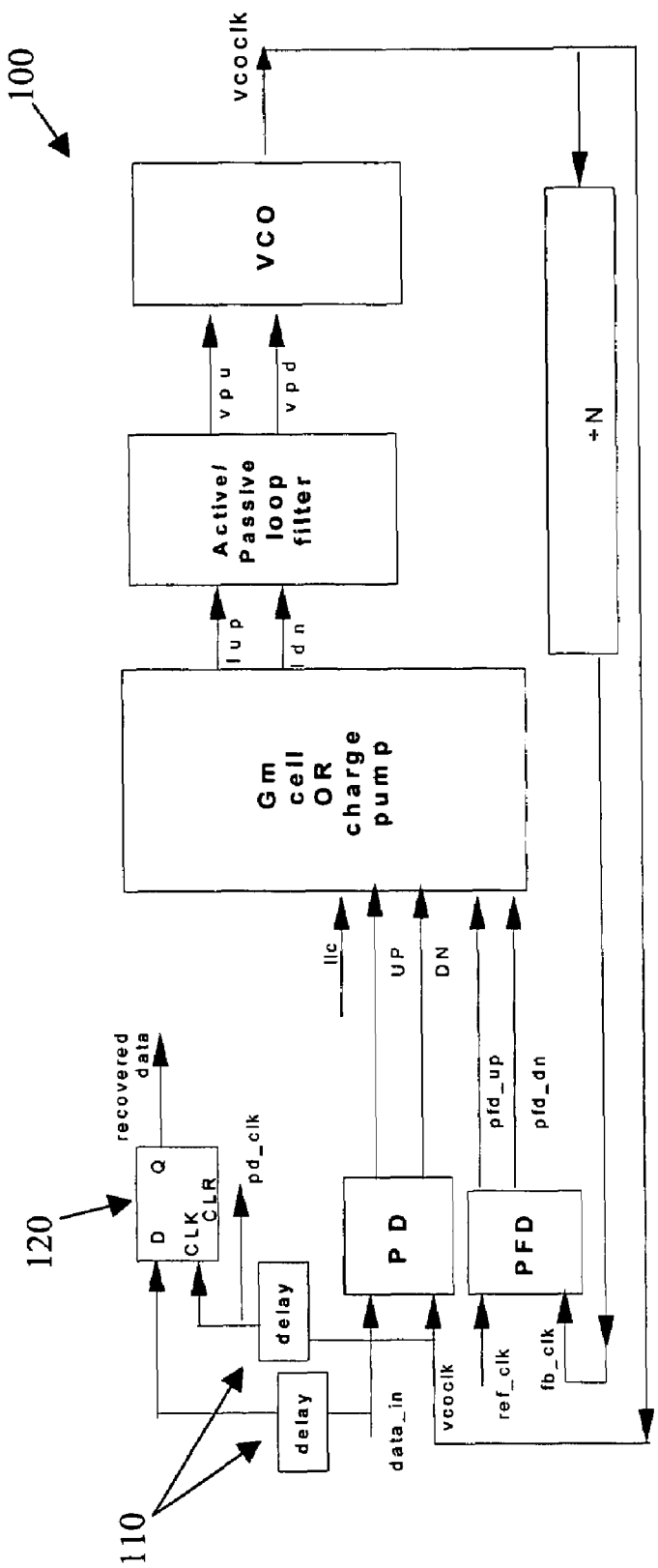
FIG. 1B shows a conventional phase locked loop.

The programmable current source 235 generates an offset current based on the setting from the MUX 233. Unlike the conventional design shown in FIG. 1B, the use of the programmable current source 235 to generate an offset current eliminates the need for the fixed path delay elements 110 (referring to FIG. 1B). Referring to FIG. 2A, there is no fixed path delay element in the delay paths 223 of the PLL 200. Furthermore, the programmable current source 235 provides better offset compensation to the PLL 200 because the offset current can be adjusted based on PVT mismatches in the individual PLL 200.

In one embodiment, the programmable current source 235 includes a number of parallel branches. Each branch includes a fixed current source 241 (e.g., 4 uA, 2 uA, etc.) and a switch S[i] 243, where i corresponds to the branch number. In the embodiments illustrated in FIG. 2B, there are six branches, six fixed current sources, and six switches S[0]-S[5]. Based on the setting from the MUX 233, the switches S[0]-S[5] are turned on or off to pass or to block the current from the respective fixed current sources. The offset current is the sum of the current passing through the parallel branches.

In one embodiment, the MUX 233 may receive the second input from a source external to the integrated circuit (IC) in which the PLL 200 is implemented, such as automated testing equipment (ATE). Alternatively, the MUX 233 may receive the second input from a state machine monitoring another piece of logic in the IC. Thus, the setting of the offset compensation circuit 230 may be changed in real time by the state machine.

Figure 2C:
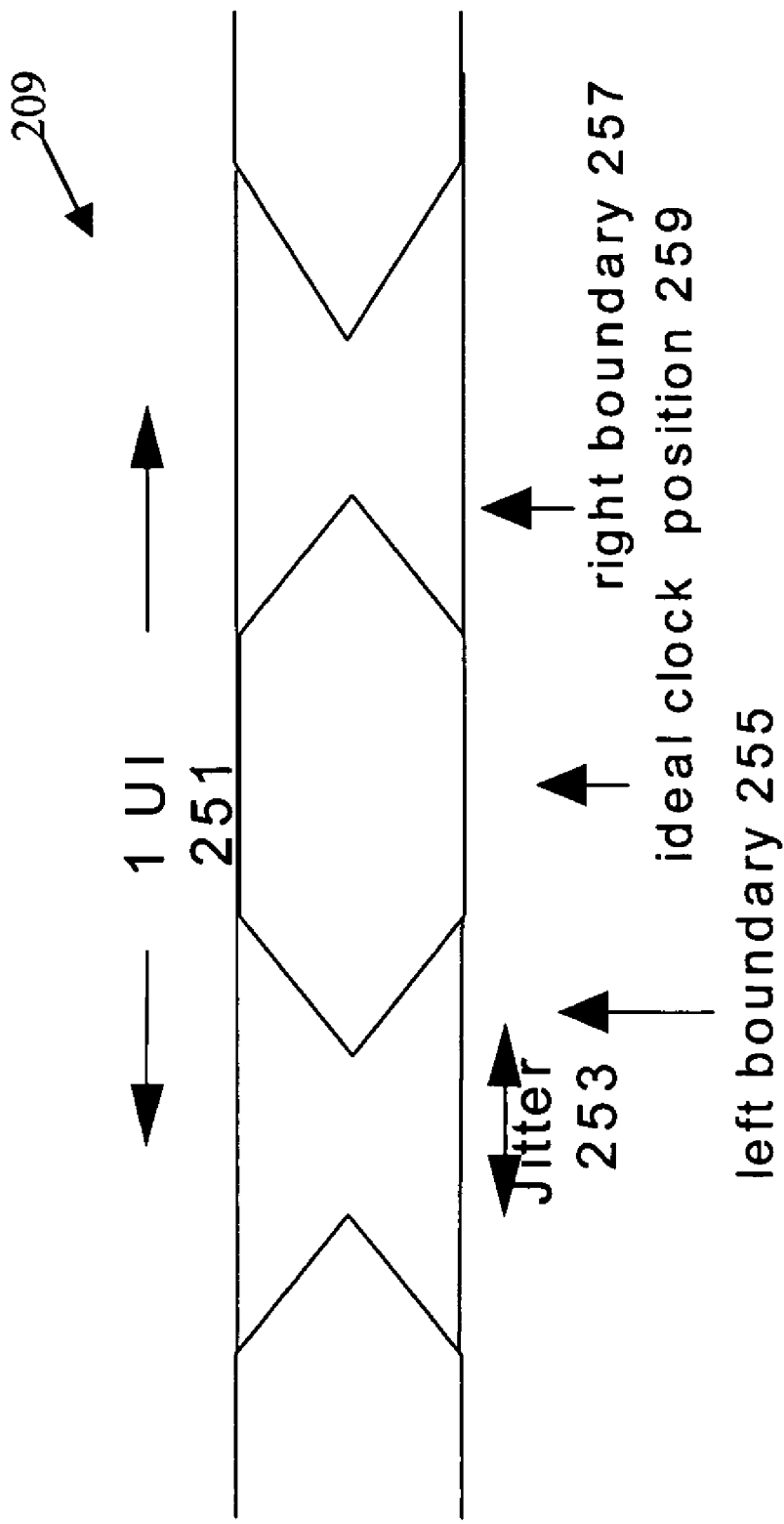
FIG. 2C shows an exemplary eye diagram of data captured using an output clock signal from one embodiment of a phase locked loop.

An example is provided below to illustrate the operation of one embodiment of the PLL 200 with the offset compensation circuit 230. In the following example, the charge pump 211 is already pre-offset with 32 uA. Thus, a default setting for the programmable current source 235 in FIG. 2B is with the switch S[5] closed and the rest of the switches S[4]-S[0] open. A sample eye diagram 209 of data_in sampled using vcoclk from the PLL 200 is shown in FIG. 2C. The tuning range of the offset current may be from approximately minus (−) 31 uA to plus (+) 32 uA. The tuning range may give approximately +/−0.3 unit intervals (UI) 251 for the SPE to move around. Referring to FIG. 2C, there is some jitter 253 between two eye openings. The ideal clock position 259 is at approximately the center of an eye opening.

During testing of the PLL 200, the ATE may look for the left boundary 255 and the right boundary 257 in the eye diagram 209 of data_in from the PLL 200 output to determine the width of the eye opening (i.e., the width between the left boundary 255 and the right boundary 257). The ATE may program the storage device 231 according to the width. In some embodiments, the static phase skew between the reference clock signal (ref_clk in FIG. 2A) and the feedback clock signal (fd_clk in FIG. 2A) is measured. A setting corresponding to a zero skew may be programmed into the storage device 231. By programming the storage device 231 for each PLL 200 individually during testing, the overall production yield of the PLLs may be improved because the mismatches across PVT in each PLL may be better compensated. By better compensating the mismatches across PVT in each PLL, the PLL is less likely to fail the tests performed on the PLL during manufacturing.

Figure 3:
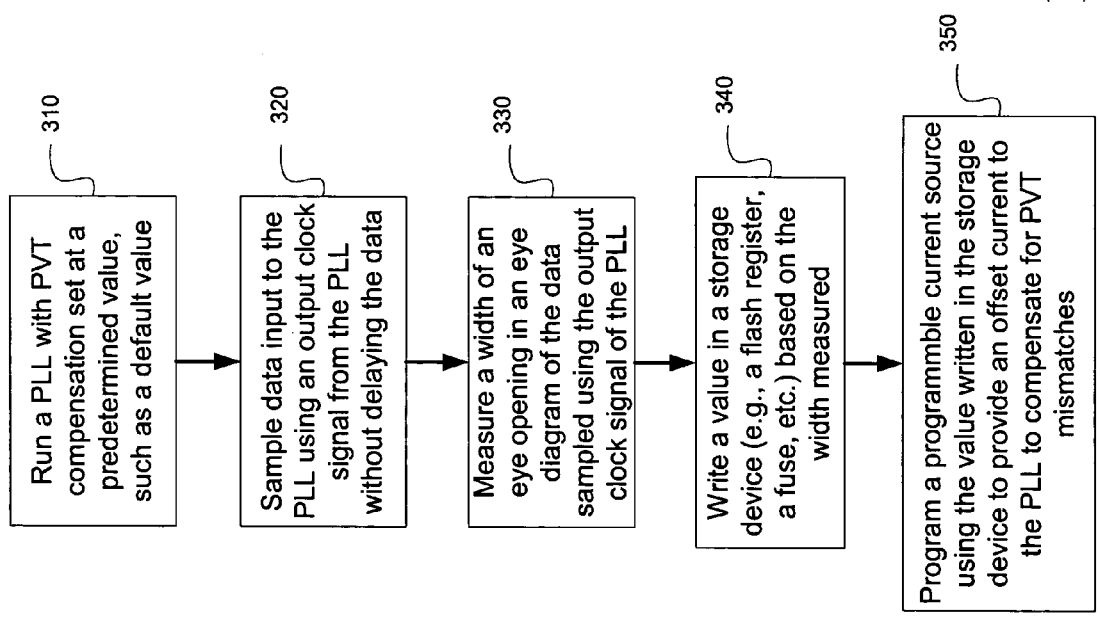
FIG. 3 shows one embodiment of a process to improve the production yield of phase locked loops.

FIG. 3 shows one embodiment of a process to improve production yield of PLLs. The process is performed by processing logic that may comprise hardware (e.g., circuitry, dedicated logic, etc.), software (such as in run on a general-purpose computer system, a server, a dedicated machine, or ATE), or a combination of both.

Referring to FIG. 3, processing logic runs a PLL with PVT compensation set at a predetermined value, such as a default value (processing block 310). Then processing logic samples data input (e.g., data_in in FIG. 2A) to the PLL using an output clock signal from the PLL without delaying the data (processing block 320). Processing logic measures a width of an eye opening in an eye diagram of the data sampled using the output clock signal of the PLL (processing block 330). For example, processing logic may monitor the bit error rate (i.e., the number of errors in sampling the data per a predetermined number of bits) to find the setting for the left and right boundaries of the eye opening (e.g., 255 and 257 in FIG. 2C). Furthermore, processing logic may test the PLL at some of the worst-case scenarios. For example, processing logic may use low transition density data with jitter added because it is generally difficult for PLLs to follow such data.

Based on the width of the eye opening, processing logic writes a value in a storage device (e.g., storage device 231 in FIG. 2B) based on the width measured (processing block 340). The storage device 231 may include a flash register, a fuse, etc. In one embodiment, the value programmed into the storage device corresponds to the ideal clock position 259 (referring to FIG. 2C) in the eye diagram 209. Processing logic programs a programmable current source (e.g., the programmable current source 235 in FIG. 2B) using the value written in the storage device to provide an offset current to the PLL to compensate for PVT mismatches in the PLL (processing block 350).

One advantage of the improved PLL is that the compensation may be performed in a low frequency path. It is in general more difficult to determine the proper amount of compensation for the PVT mismatches in the PLL at high frequencies. Therefore, performing the compensation at a low frequency is typically preferred. Furthermore, the technique discussed above does not add inter-symbol interference (ISI) jitter to test the PLL, where ISI is usually caused by limited channel bandwidth. In some embodiments, the resolution for the SPE correction depends on the number of bits in the storage device 231, and hence, may be readily designed to be higher than the conventional design. Moreover, reducing the SPE makes it possible for a clock de-skew or zero delay buffer (ZDB) application to have a true zero delay between the reference clock signal and the feedback clock signal.

Another advantage of the improved PLL is to allow screening of the PLL by measuring the width of the eye opening in the corresponding eye diagram instead of introducing some predetermined amount of jitter to the PLL during testing. Introducing jitter to the PLL during testing is not preferred because it is generally difficult to control the amount of jitter introduced, and hence, the conventional screening of PLLs is prone to error. Moreover, one should appreciate that the offset compensation technique discussed above is applicable to both clock data recovery (CDR) applications, such as in a receive loop, and ZDB applications, such as in a transmit loop.

Figure 4:
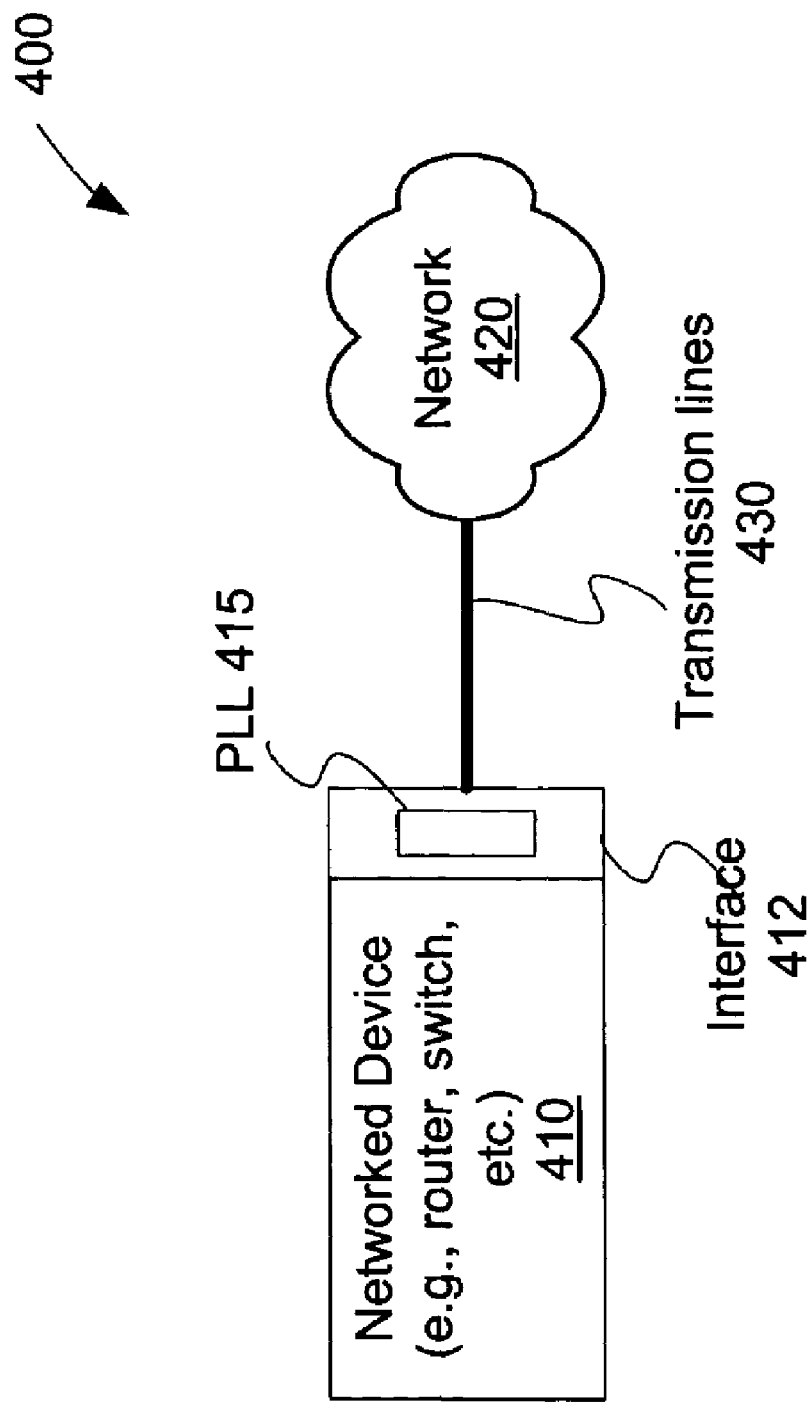
FIG. 4 shows one embodiment of a networked system.

FIG. 4 illustrates one embodiment of a networked system 400 usable with some embodiments of the present invention. The system 400 includes a networked device 410, transmission lines 430, and a network 420. The networked device 410 may be a router, a switch, etc. The networked device 410 includes an interface 412 having a PLL 415 with offset compensation. The transmission lines 430 couple the networked device 410 via the interface 412 to the network 420. Signals from the networked device 410 may propagate across the transmission lines 430 to the network 420. Likewise, the networked device 410 may receive signals via the transmission lines 430 from the network 420. The PLL 415 in the interface 412 may recover data received from the network 420. Alternatively, the PLL 415 may multiply a transmit clock signal to transmit data across the transmission lines 430. Exemplary embodiments of the PLL 415 have been discussed above with reference to FIGS. 2A-2C.

Note that any or all of the components of the system 400 and associated hardwire may be used in various embodiments of the present invention. However, it can be appreciated that other configurations of the systems may include additional or fewer components than those illustrated in FIG. 4.

The foregoing discussion merely describes some exemplary embodiments of the present invention. One skilled in the art will readily recognize from such discussion, the accompanying drawings, and the claims that various modifications can be made without departing from the spirit and scope of the appended claims. The description is thus to be regarded as illustrative instead of limiting.

What is claimed is:

1. An apparatus, comprising:
a phase locked loop (PLL) comprising a charge pump; and
an offset compensation circuit coupled to the charge pump to provide an offset current to the charge pump to reduce a static phase error of the PLL caused by a mismatch in at least one of a process variation, a voltage, and a temperature, wherein the offset compensation circuit comprises
a programmable current source to generate the offset current,
a storage device coupled to the programmable current source to store a first value, and
a multiplexer (MUX) coupled between the storage device and the programmable current source to output the first value stored in the storage device or a second value to program the programmable current source.

2. The apparatus of claim 1, wherein the storage device comprises a flash register.

3. The apparatus of claim 1, wherein the storage device comprises a fuse.

4. The apparatus of claim 1, wherein the second value is from a tester.

5. The apparatus of claim 1, wherein the second value is from a state machine, the state machine is operable to monitor a logic circuit residing with the PLL on a substrate and to change the second value in response to result of monitoring the logic circuit.

6. The apparatus of claim 1, wherein the PLL further comprises a phase frequency detector (PFD) coupled to the charge pump.

7. The apparatus of claim 6, further comprises:
a network device comprising a transmit loop, the transmit loop comprising the PLL and the offset compensation circuit; and
at least one transmission line coupled to the network device, wherein the transmit loop is operable to transmit data over the at least one transmission line.

8. The apparatus of claim 1, wherein the PLL further comprises a phase detector (PD) coupled to the charge pump to provide a first frequency lock.

9. The apparatus of claim 1, further comprising:
a network device comprising a receive loop, the receive loop comprising the PLL and the offset compensation circuit; and
at least one transmission line coupled to the network device, wherein the receive loop is operable to receive data from the at least one transmission line.

10. A method, comprising:
running a phase locked loop (PLL) with a compensation for at least one of a process variation, a voltage, and a temperature, the compensation being set at a predetermined value;
providing said compensation by
using a programmable current source to provide an offset current to a charge pump of the PLL,
storing a first value in a storage device coupled to the programmable current source, and
selecting one of the first value and a second value using a multiplexer (MUX) coupled between the storage device and the programmable current source to program the programmable current source;
measuring jitter tolerance of data sampled using an output clock signal from the PLL; and
reducing a static phase error of the PLL based on the jitter tolerance.

11. The method of claim 10, further comprising receiving the second value from a tester.

12. The method of claim 10, further comprising receiving the second value from a state machine operable to monitor a logic circuit residing with the PLL on a substrate and to change the second value in response to result of monitoring the logic circuit.

* * * * *